United States Patent
Fukunaga et al.

(10) Patent No.: US 10,573,741 B1
(45) Date of Patent: Feb. 25, 2020

(54) VERTICAL POWER MOSFET DEVICE HAVING DOPED REGIONS BETWEEN INSULATED TRENCHES AND A JUNCTION ARRANGED THEREBETWEEN

(71) Applicant: SANKEN ELECTRIC CO., LTD., Niiza-Shi, Saitama (JP)

(72) Inventors: Shunsuke Fukunaga, Saitama (JP); Taro Kondo, Niiza (JP); Shinji Kudo, Hiki-Gun (JP)

(73) Assignee: SANKEN ELECTRIC CO., LTD., Niiza-shi (JP)

(*) Notice: Subject to any disclaimer, the term of this patent is extended or adjusted under 35 U.S.C. 154(b) by 27 days.

(21) Appl. No.: 16/137,598

(22) Filed: Sep. 21, 2018

(51) Int. Cl.
*H01L 29/78* (2006.01)
*H01L 29/06* (2006.01)
*H01L 29/08* (2006.01)
*H01L 29/40* (2006.01)

(52) U.S. Cl.
CPC ...... *H01L 29/7806* (2013.01); *H01L 29/0696* (2013.01); *H01L 29/08* (2013.01); *H01L 29/407* (2013.01); *H01L 29/7813* (2013.01)

(58) Field of Classification Search
CPC .......... H01L 29/66712–66734; H01L 29/7802–7815; H01L 29/402–407; H01L 29/66734; H01L 29/7813; H01L 29/7806
See application file for complete search history.

(56) References Cited

U.S. PATENT DOCUMENTS

| | | | |
|---|---|---|---|
| 6,351,018 B1 | 2/2002 | Sapp | |
| 8,704,295 B1* | 4/2014 | Darwish | H01L 29/7806 257/330 |
| 9,825,027 B1* | 11/2017 | Fukunaga | H01L 29/407 |
| 9,929,265 B1* | 3/2018 | Kondo | H01L 29/7804 |
| 2003/0022474 A1* | 1/2003 | Grover | H01L 21/266 438/570 |
| 2005/0199918 A1* | 9/2005 | Calafut | H01L 29/407 257/260 |
| 2008/0150020 A1 | 6/2008 | Challa et al. | |
| 2016/0013311 A1* | 1/2016 | Nelle | H01L 27/0629 257/331 |
| 2017/0213906 A1* | 7/2017 | Li | H01L 29/7813 |
| 2018/0337172 A1* | 11/2018 | Kondo | H01L 27/0652 |
| 2019/0115436 A1* | 4/2019 | Hossain | H01L 29/0619 |

* cited by examiner

*Primary Examiner* — Younes Boulghassoul
(74) *Attorney, Agent, or Firm* — Metrolex IP Law Group, PLLC

(57) ABSTRACT

A semiconductor device in embodiments, may include a device region having: two active trenches, each having at least a gate electrode. Two insulated trenches each having an electrode may be formed between the two active trenches separated by a junction. First p-doped layers may be provided between a first active trench and a first insulated trench, and between a second active trenches and a second insulated trench. Second p-doped layers may be provided between a first insulated trench and a second insulated trench with the junction arranged therebetween. The second p-doped layers may be provided on an external surface of the respective first one and second one of the two insulated trenches at a depth and a thickness set to form a current path when the power semiconductor device is in an OFF state.

10 Claims, 4 Drawing Sheets

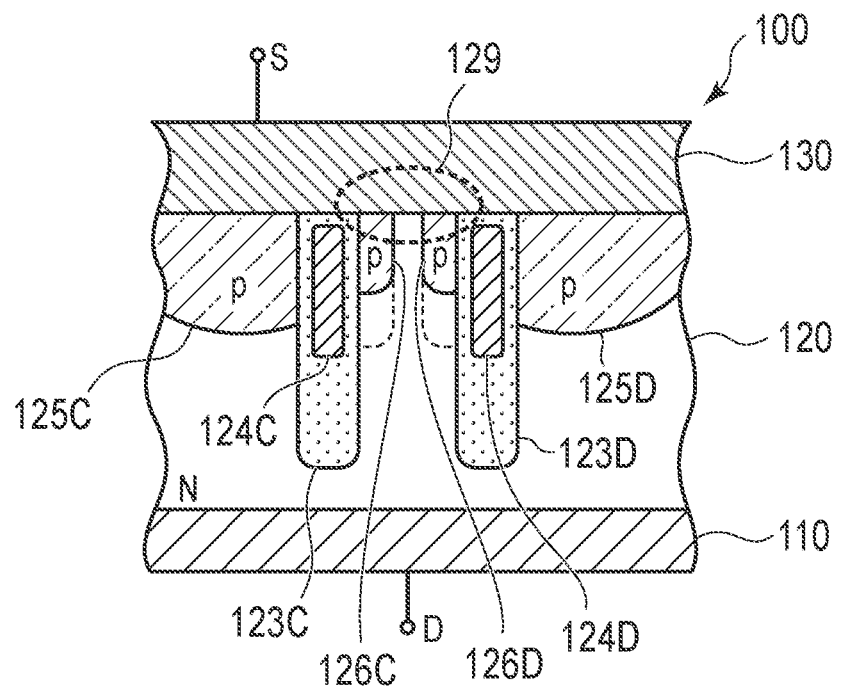
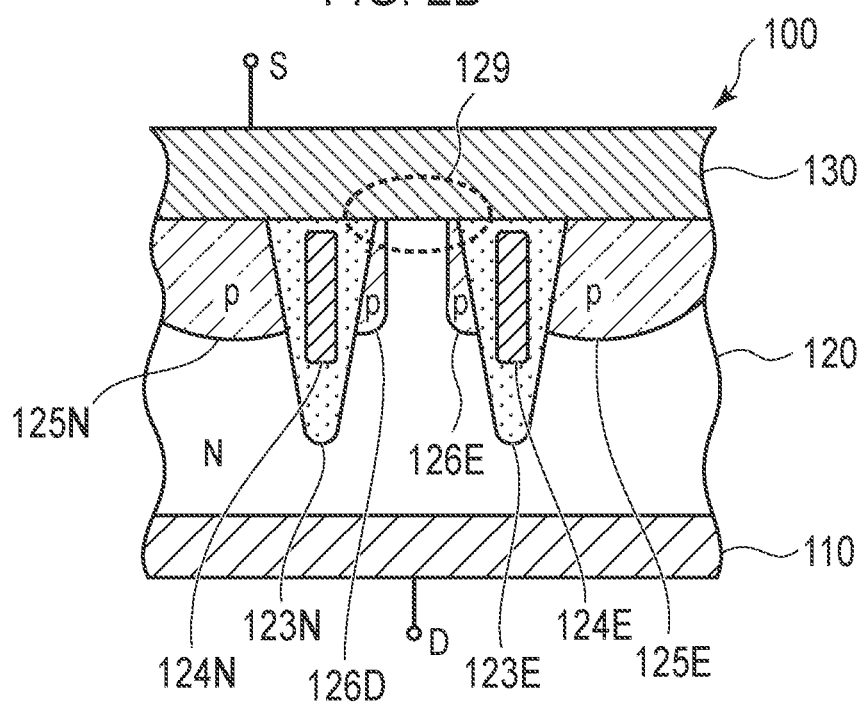

VERTICAL POWER MOSFET DEVICE HAVING DOPED REGIONS BETWEEN INSULATED TRENCHES AND A JUNCTION ARRANGED THEREBETWEEN

BACKGROUND

1. Field of the Invention

The present disclosure is generally related to a semiconductor device, and specifically to a semiconductor device having a through hole, source and gate structures.

2. Description of Related Art

A trench structure in which a gate electrode is embedded in a trench may be adopted for a semiconductor device, including an integrated power semiconductor device such as a vertical MOSFET or related composite or hybrid device. Examples of trench structures exist in the art having edge termination and breakdown characteristics (for example, see U.S. Patent Publication No. 2008/0150020 ("Patent Literature 1")). In Patent Literature 1, a source electrode may be positioned in a trench between a gate electrode and the bottom of the trench.

SUMMARY

In accordance with one or more embodiments, a semiconductor device may be provided in which a device region comprises: two active trenches, each having at least a gate electrode; two insulated trenches formed between the two active trenches, the two insulated trenches separated by a space that forms a junction, each of the two insulated trenches having an electrode formed there within; first p-doped layers between a first one of the two active trenches and a first one of the two insulated trenches, and between a second one of the two active trenches and a second one of the two insulated trenches; and second p-doped layers between a first one of the two insulated trenches and a second one of the two insulated trenches with the junction arranged therebetween. Further in accordance with one or more embodiments, the second p-doped layers are provided on an external surface of the respective first one and second one of the two insulated trenches at a depth and a thickness set to form a current path when the power semiconductor device is in an OFF state.

Further in accordance with one or more embodiments, in the semiconductor device a thickness of the second p-doped layers may be approximately equal to a thickness of the junction and a length of the second p-doped layers may be approximately equal to a depth of the electrode of the insulated trenches.

Further in accordance with one or more embodiments, in the semiconductor device a cross-sectional shape of the insulated trenches may comprise a tapered shape that narrows with increasing depth of the insulated trenches. Each of the second p-doped layers are tapered on a first side that contacts with external surfaces of respective ones of the insulated trenches and are not tapered on a second side that faces the junction. The electrode of the insulated trenches may comprise one of: polysilicon; and metal.

Further in accordance with one or more embodiments, in the semiconductor device a p-type concentration of the first p-doped layer defined by Cb, and a p-type concentration of the second p-doped layer defined by Ca is set such that Cb/Ca>10.

In accordance with one or more embodiments, or alternative or additional embodiments, an array of power semiconductor devices as described herein above may be provided in a series of power semiconductor devices along a length direction of a substrate. In one example embodiment, from a top view perspective of the array of power semiconductor devices, the series of power semiconductor devices may be continuously arranged in a length direction of the array. In another example embodiment, from a top view perspective of the array of power semiconductor devices, the series of power semiconductor devices may be arranged such that the second p-doped layers are alternately arranged with areas where the second p-doped layers are not provided along the length direction of the array at regular intervals on both sides of the junction. In still another example embodiment, from a top view perspective of the array of power semiconductor devices, the series of power semiconductor devices may be arranged such that the second p-doped layers are alternately arranged with areas where the second p-doped layers are not provided along the length direction of the array at staggered intervals on both sides of the junction. In yet another example, embodiment, from a top view perspective of the array of power semiconductor devices, the series of power semiconductor devices is arranged such that the second p-doped layers are arranged along the length direction of the array to extend between the insulated trenches at regular intervals.

Those skilled in the art will recognize additional features and advantages upon reading the following detailed description, and upon viewing the accompanying drawings.

BRIEF DESCRIPTION OF DRAWINGS

The accompanying drawings, which are incorporated herein and constitute part of this specification, illustrate exemplary embodiments of the invention, and together with the general description given above and the detailed description given below, serve to explain the features of the invention.

FIG. 2A is a diagram further illustrating a cross-sectional view of a configuration of a power semiconductor device having p-doped trench liners with improved length according to one or more embodiments, or alternative or additional embodiments;

FIG. 2B is a diagram further illustrating a cross-sectional view of a configuration of a power semiconductor device having p-doped trench liners and trench with improved shape according to one or more embodiments, or alternative or additional embodiments;

DETAILED DESCRIPTION

Figure 1A:
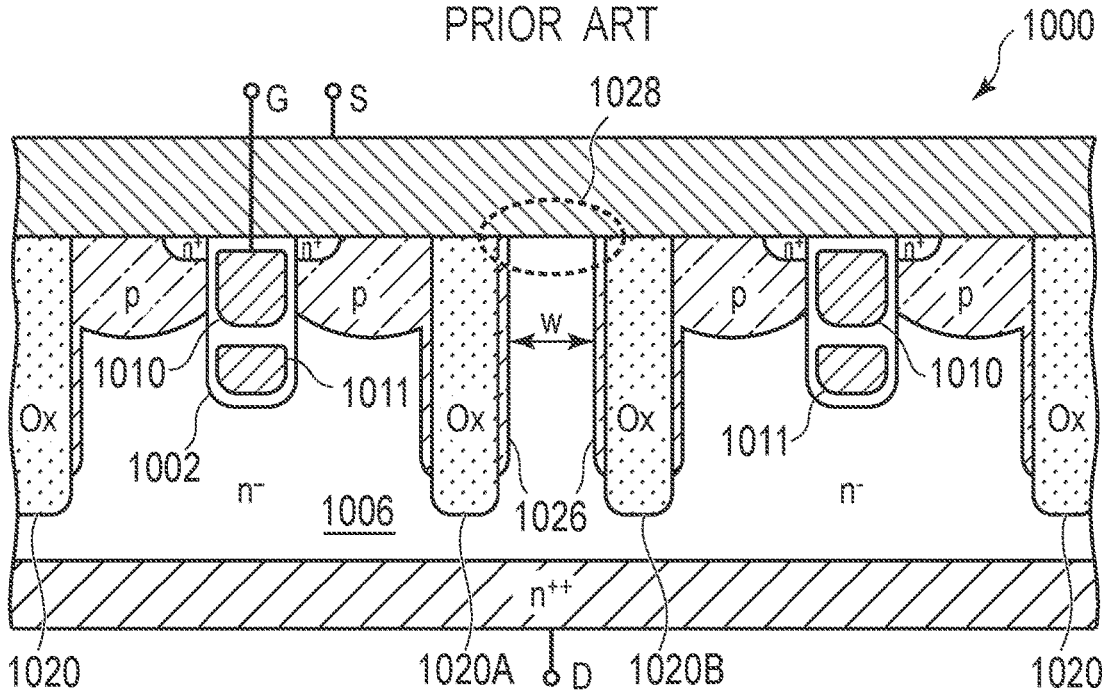
FIG. 1A is a diagram illustrating a cross-sectional view of a prior art trench configuration of a power semiconductor device having thin p-doped liners on the exterior of trench sidewalls.

Embodiments are described with reference to drawings, in which the same constituents are designated by the same reference numerals and duplicate explanation concerning the same constituents may be omitted for brevity and ease of explanation. The drawings are illustrative and exemplary in nature and provided to facilitate understanding of the illustrated embodiments and may not be exhaustive or limiting. Dimensions or proportions in the drawings are not intended to impose restrictions on the disclosed embodiments. For this reason, specific dimensions and the like should be interpreted with the accompanying descriptions taken into consideration. In addition, the drawings include parts whose dimensional relationship and ratios are different from one drawing to another.

Prepositions, such as "on", "over" and "above" may be defined with respect to a surface, for example a layer surface, regardless of the orientation of the surface in space.

In a conventional arrangement, such as illustrated in FIG. 1A and disclosed in Patent Document 1, a power semiconductor device 1000 may employ doped sidewall dielectric filled trenches 1026. The power semiconductor device 1000 may have an electrode 1011 in the lower part of a trench 1002 that shields a gate electrode 1010 from a drift region 1006 in order to reduce parasitic capacitance.

Dielectric-filled trenches 1020 with p-doped liners on the exterior sidewalls thereof may provide for vertical charge control. A Schottky junction 1028 may be formed between two trenches 1020A and 1020B that form a mesa of width W. The structure of the Schottky junction 1028 may be interspersed throughout a cell array constituting the device 1000 to enhance performance characteristics. The forward voltage drop of the structure may be reduced by taking advantage of the low barrier height of the structure of the Schottky junction 1028. The Schottky junction 1028 may additionally have an inherent reverse recovery speed advantage compared to the normal PN junction of a vertical power device. Sidewall leakage paths may be eliminated by selective doping of the sidewalls of dielectric-filled trenches 1020.

The arrangement illustrated and described above in connection with FIG. 1A may have drawbacks in that the trench 1020A is filled only with a dielectric or an insulator. Because no current path is generated in the trenches, a deterioration of breakdown resistance may be experienced of the Schottky junction 1028. Further, the p-doped liners 1026, being thin, may increase the resistance leading to increased heat generation during operation for the power semiconductor device 1000.

Figure 1B:
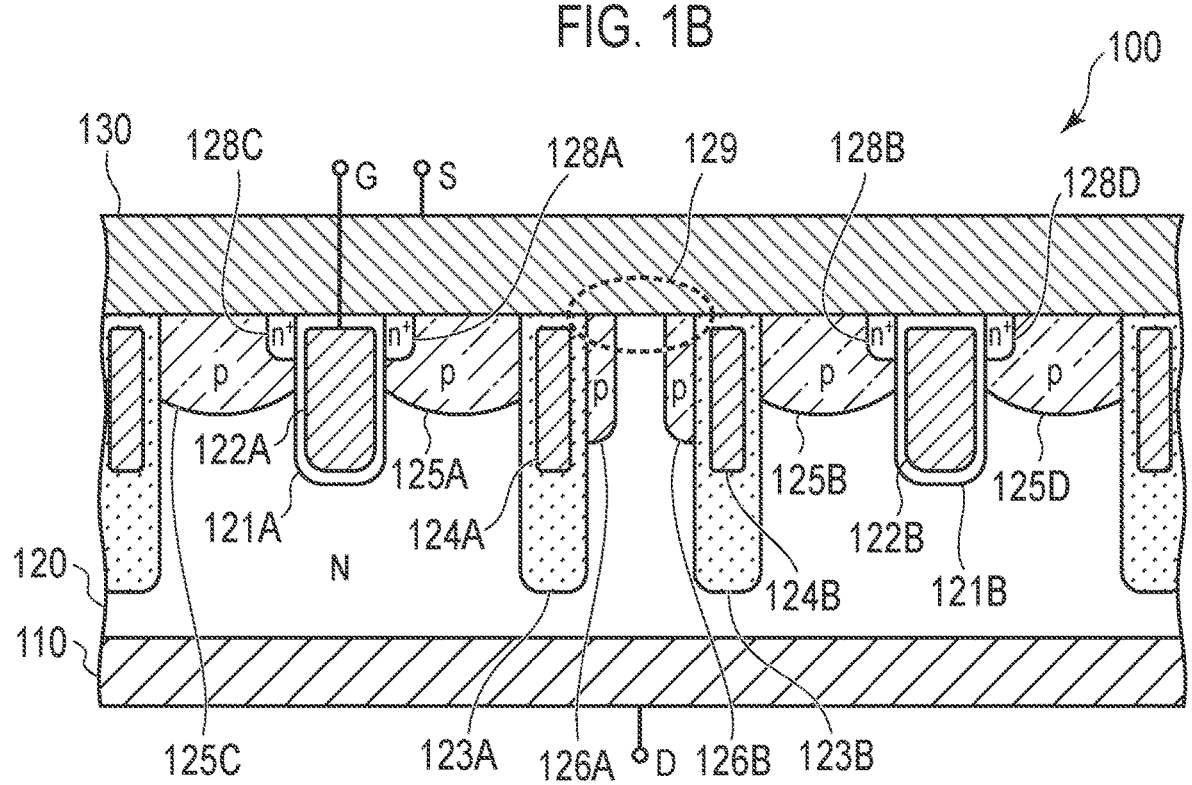
FIG. 1B is a diagram illustrating a cross-sectional view of a trench configuration of a power semiconductor device having p-doped trench liners with shape and thickness according to one or more embodiments.

To address the above-described and other drawbacks, as illustrated and disclosed in connection with FIG. 1B, an improved arrangement for a power semiconductor device 100 is provided that may employ doped sidewall dielectric filled trenches 123A and 123B.

The power semiconductor device 100, in accordance with one or more embodiments, may be formed with trenches 123A and 123B, which may be insulated trenches filled with an insulator or dielectric material and may include electrodes 124A and 124B respectively. The electrodes 124A and 124B may be made from polysilicon or metal. The p-doped layers 126A and 126B may be placed in an inversion condition when the power semiconductor device 100 is OFF. The inversion condition leads to the generation of a current path that leads to improvements in breakdown resistance. The concentration of majority charge carriers in the p-doped layers 126A and 126B is preferably lower than that of p-doped base layer, leading to fast inversion and improved breakdown resistance. In such a configuration, a parameter Cb/Ca, where Cb corresponds to the P concentration of base layer, and Ca corresponds to the P concentration of p layer 126, may be set to Cb/Ca>10. Moreover, the doping concentration of the p-doped layers 126A and 126B may be set lower as the trench depth is set shorter. In one or more embodiments, the electrodes 124A and 124B may be arranged within the insulated trench 123A and 123B such that they are positioned closer to the p-doped layers 126A and 126B, resulting in fast inversion and improved breakdown resistance.

The trenches 123A and 123B may be provided with p-doped layers 126A and 126B in a region associated with a Schottky junction 129. The effect of the thickness and length of the p-doped layers 126A and 126B may have enhanced inversion characteristics when the power semiconductor device 100 is OFF. As a result, a current path may be generated that improves the breakdown strength and characteristics of the Schottky junction 129.

The power semiconductor device 100 may further be provided with electrodes 122A in a lower part of trenches 121A and 121B. The trenches 123A and 123B may be dielectric or insulation filled trenches with p-doped layers 126A and 126B respectively on the exterior sidewalls thereof in region of the Schottky junction 129. Multiple versions of the structure of the Schottky junction 129 may be is interspersed throughout a cell array (300, 310, 400, 410) constituting the device 100 to enhance performance characteristics, as will be described in greater detail hereinafter. It will be appreciated that the configuration of the p-doped layers 126A and 126B as well as the structure of the Schottky junction 129 may impact the forward voltage drop of the structure. The Schottky junction 129 in various embodiments, may additionally have an inherent reverse recovery speed advantage compared to conventional arrangements. Sidewall leakage paths may eliminated by selective doping of the p-doped layers 126A and 126B of the trenches 123A and 123B. The trenches 123A and 123B may further be accommodate electrodes 124A and 124B.

The power semiconductor device 100 may further be provided with a drain electrode layer 110, a drift region 120, a source electrode layer 130, and electrodes 122A and 122B, such as gate electrodes. In some embodiments, the source electrode 130 may include aluminum (Al). The electrodes 122B may be positioned in active trenches 121A and 121B. The active trench 121A and the insulated trench 123A, and the active trench 121B and the insulated trench 123B may be separated respectively by p-doped liners 125A and 125B. Additional p-doped liners 125C and 125D may be provided on the sides of the active trenches 121A and 121B opposite the Schottky junction 129. As discussed above, the p-doped layers 126A and 126B may be provided on the exterior surface between the insulating trenches 123A and 123B in the region of the Schottky junction 129. The active trenches 121A and 121B may be provided with an n-doped layer 128A, 128B, 128C and 128D on the source electrode layer 130 side thereof adjacent to the p-doped liners 125A, 125B, 125C, and 125D.\

In accordance with one or more embodiments, or one or more additional or alternative embodiments, as illustrated in FIG. 2A, a length and thickness of the p-doped layers 126C and 126D may be adjusted for effect in order to set the breakdown strength, recovery speed, breakdown resistance and other characteristics of the Schottky junction 129. In some embodiments, the length of the p-doped layers 126A may be from about half of the depth of the electrodes 124C and 124D, to just less than the depth of the electrodes 124C and 124D. Additionally, as illustrated in FIG. 2B, the active trenches may be configured with a tapered shape. For example, insulating trenches 123N and 123E may be provided with a tapered shape, tapering from a first width to a more narrow width in the depth direction of the trenches. It should be noted that the "tip" of the insulating trenches 123N and 123E should be rounded to avoid undesirable process or operational characteristics or limitations.

Similarly, as the shape profile of the insulating trenches 123N and 123E change, the shape of the p-doped layers may change. For example, p-doped layers 126D and 126E may be provided on the exterior surfaces of the insulation trenches 123N and 123E in the region of the Schottky junction 129. However, because the sides of the insulation trenches 123N and 123E are tapered, the profile of the p-doped layers 126D and 126E may be sloping, at least on one side thereof. Advantages can be realized by such shaping, because current paths may be more easily generated in the structure. The Schottky junction 129 is formed between the trench 123A and the trench 123B.

In accordance with one or more of the embodiments described herein, lower forward bias voltages and faster switching may be achieved. In addition, fabrication may be easier. One or more of the embodiments of the power semiconductor device described herein above may be part of an array of devices as illustrated in FIG. 3A, FIG. 3B, FIG. 4A and FIG. 4B, which illustrate a top view of a power semiconductor device containing the structures described herein. For ease of description and illustration, the figures FIG. 3A, FIG. 3B, FIG. 4A and FIG. 4B, are shown as if the source electrode 130 is transparent or removed.

Figure 3A:
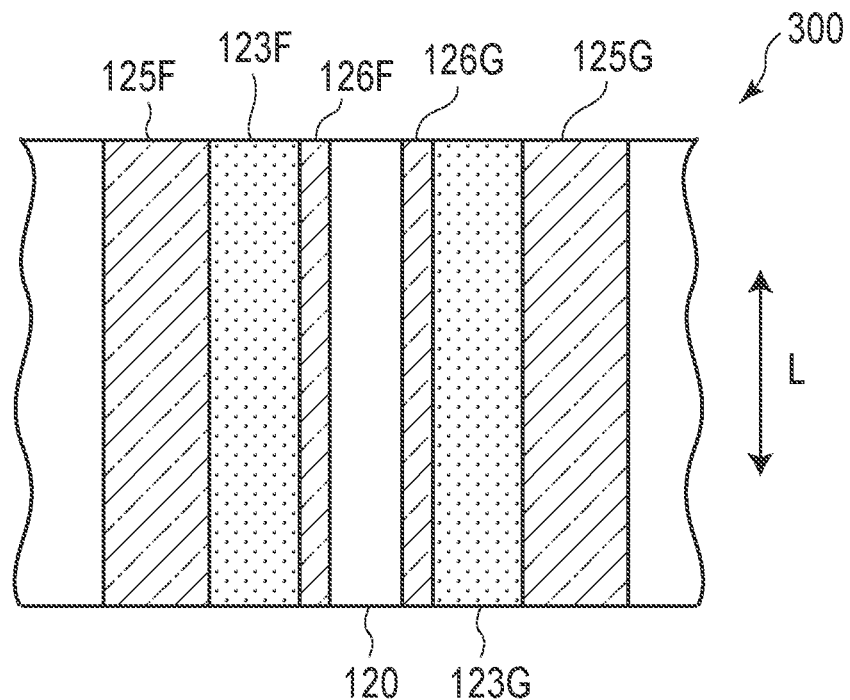
FIG. 3A is a diagram illustrating a top view a power semiconductor device such as illustrated in FIG. 2A or FIG. 2B, showing a continuous arrangement of p-doped trench liners and trenches having an improved shape in an array of power semiconductor devices according to one or more embodiments, or alternative or additional embodiments.

For example, in FIG. 3A, the p-doped liners 125F and 125G correspond to a top view of the p-doped liners 125 variously described herein in connection with FIG. 1B, FIG. 2A and FIG. 2B for an array 300 of power semiconductor devices. The insulated trenches 123F and 123G correspond to a top view of the insulated trenches 123 variously described herein in connection with FIG. 1B, FIG. 2A and FIG. 2B. The p-doped layers 126F and 126G correspond to a top view of the p-doped layers 126 variously described herein in connection with FIG. 1B, FIG. 2A and FIG. 2B. The drift region 120 is visible from the top view. The array 300 illustrated in FIG. 3A represents a power semiconductor configuration that is relatively easy to manufacture.

Figure 3B:
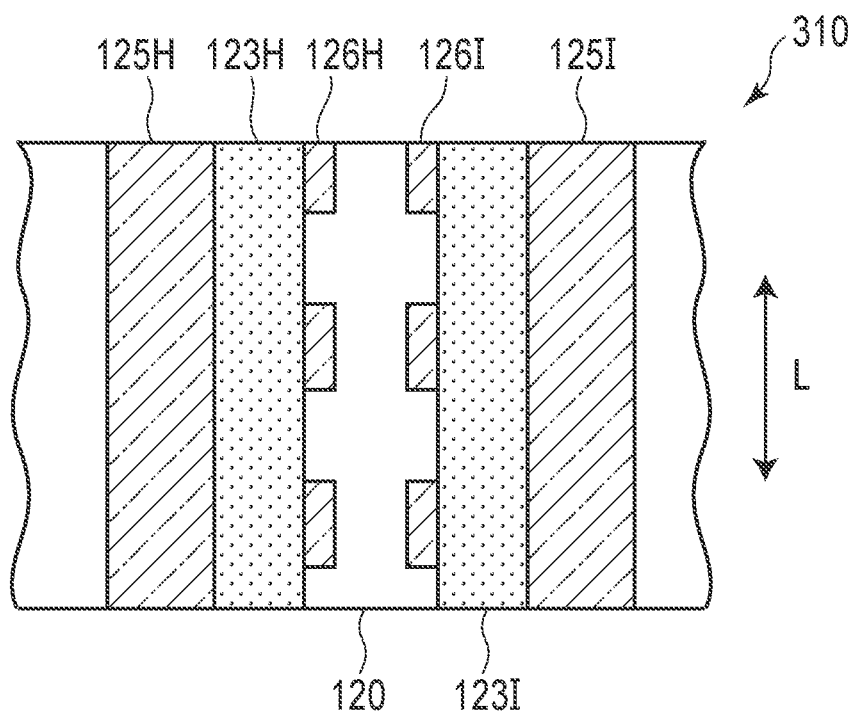
FIG. 3B is a diagram further illustrating a top view a power semiconductor device such as illustrated in FIG. 2A or FIG. 2B, showing a regular alternating arrangement of areas of p-doped trench liners, areas where p-doped trench liners are not present and trenches having an improved shape in another array of power semiconductor devices according to one or more embodiments, or alternative or additional embodiments.

In FIG. 3B, the p-doped liners 125H and 125I correspond to a top view of the p-doped liners 125 variously described herein in connection with FIG. 1B, FIG. 2A and FIG. 2B for an array 310 of power semiconductor devices. The insulated trenches 123H and 123I correspond to a top view of the insulated trenches 123 variously described herein in connection with FIG. 1B, FIG. 2A and FIG. 2B. The p-doped layers 126H and 126I correspond to a top view of the p-doped layers 126 variously described herein in connection with FIG. 1B, FIG. 2A and FIG. 2B. In FIG. 3B, the p-doped layers 126H and 126I are arranged such that they alternate at regular intervals with areas where no p-doped layers 126H and 126I are present along a length direction L of the array 310 of power semiconductor devices. The array 310 illustrated in FIG. 3B represents a power semiconductor configuration that provides a larger current path for breakdown current.

Figure 4A:
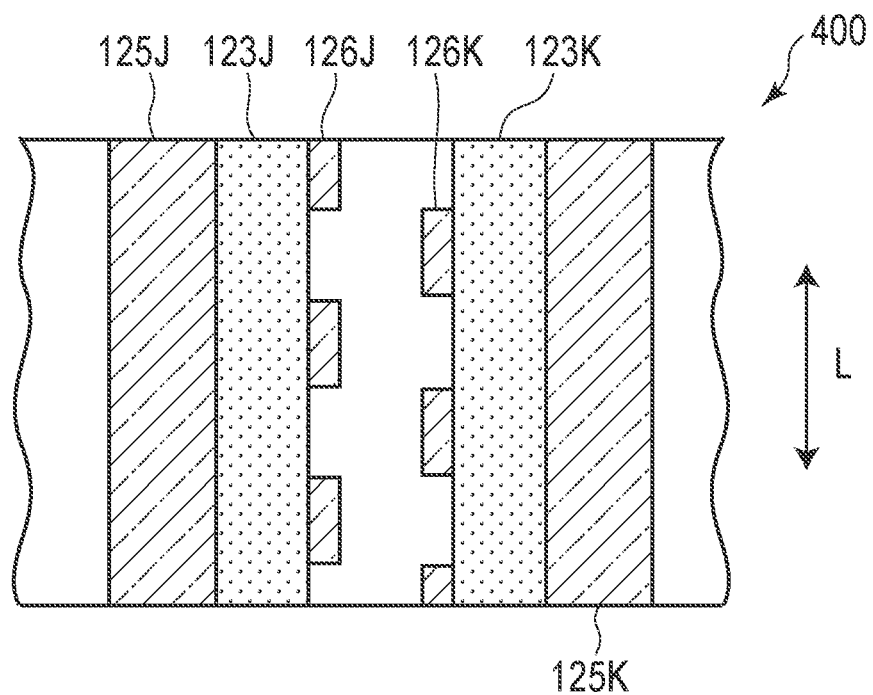
FIG. 4A is a diagram further illustrating a top view a power semiconductor device, showing a staggered alternating arrangement of areas of p-doped trench liners, areas where p-doped trench liners are not present and trenches having an improved shape in another array of power semiconductor devices according to one or more embodiments, or alternative or additional embodiments.

In FIG. 4A, the p-doped liners 125J and 125K correspond to a top view of the p-doped liners 125 variously described herein in connection with FIG. 1B, FIG. 2A and FIG. 2B for an array 400 of power semiconductor devices. The insulated trenches 123J and 123K correspond to a top view of the insulated trenches 123 variously described herein in connection with FIG. 1B, FIG. 2A and FIG. 2B. The p-doped layers 126J and 126K correspond to a top view of the p-doped layers 126 variously described herein in connection with FIG. 1B, FIG. 2A and FIG. 2B. In FIG. 3B, the p-doped layers 126H and 126I are arranged such that they alternate at staggered intervals with areas where no p-doped layers 126H and 126I are present along a length direction L of the array 310 of power semiconductor devices. The array 400 illustrated in FIG. 4A represents a power semiconductor configuration that provides a larger current path for breakdown current.

Figure 4B:
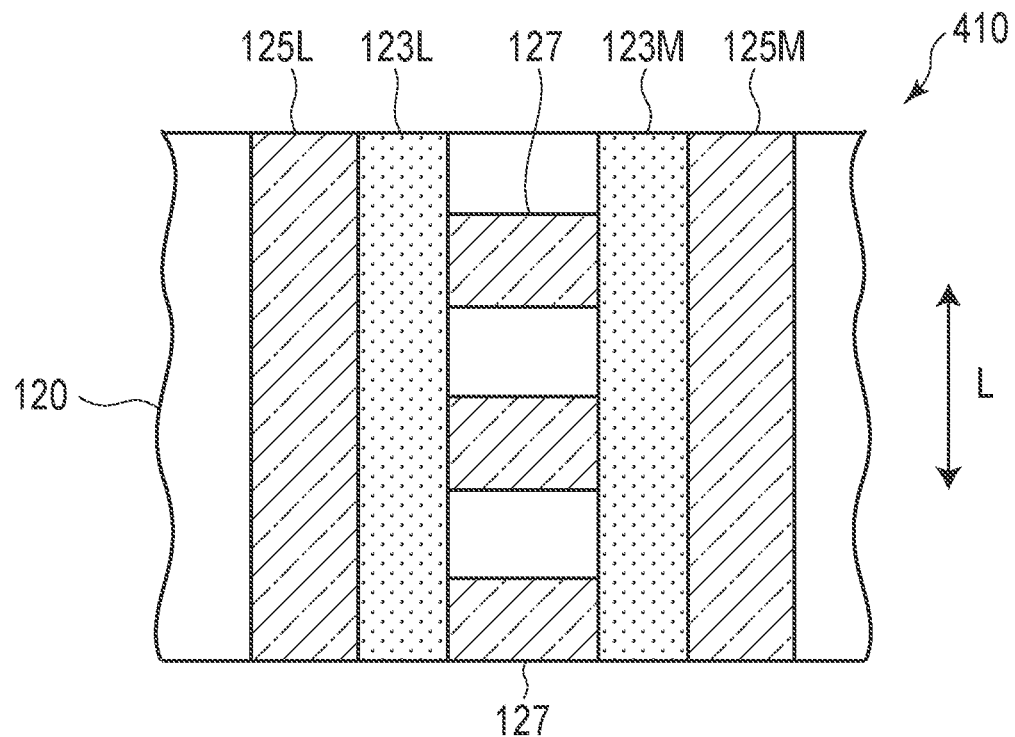
FIG. 4B is a diagram further illustrating a top view a power semiconductor device, showing a alternating arrangement of areas of p-doped trench liners extending across an inter-trench region, areas where p-doped trench liners are not present and trenches having an improved shape in another array of power semiconductor devices according to one or more embodiments, or alternative or additional embodiments.

In FIG. 4B, the p-doped liners 125L and 125M correspond to a top view of the p-doped liners 125 variously described herein in connection with FIG. 1B, FIG. 2A and FIG. 2B for an array 410 of power semiconductor devices. The insulated trenches 123L and 123M correspond to a top view of the insulated trenches 123 variously described herein in connection with FIG. 1B, FIG. 2A and FIG. 2B. A series of p-doped layers 127 correspond to a top view of the structures variously described herein in connection with FIG. 1B, FIG. 2A and FIG. 2B, with the p-doped layers 126J and 126K being replaced with the p-doped layers 127 that extend across the Schottky junction 129 at various regular intervals and are arranged such that they alternate with areas where no p-doped layers 127 are present along a length direction L of the array 410 of power semiconductor devices. The array 410 illustrated in FIG. 4B represents a power semiconductor configuration that is relatively easy to manufacture.

Although one or more embodiments as described above herein may be directed to devices having a particular arrangement of layers with conductivity types, e.g. N, N+, P, and so on, other embodiments may be directed to devices in which the conductivity types are reversed or otherwise modified. Furthermore, the above-described aspects may be combined with each other as practicable within the contemplated scope of embodiments. The above described embodiments are to be considered in all respects as illustrative, and not restrictive. The illustrated and described embodiments may be extended to encompass other embodiments in addition to those specifically described above without departing from the intended scope of the invention. The scope of the invention is to be determined by the appended claims when read in light of the specification including equivalents, rather than solely by the foregoing description. Thus, all configurations including configurations that fall within equivalent arrangements of the claims are intended to be embraced in the invention.

What is claimed is:

1. A semiconductor device, comprising:
a device region comprising:
two active trenches, each having at least a gate electrode;
two insulated trenches formed between the two active trenches, the two insulated trenches separated by a space that forms a junction, each of the two insulated trenches having an electrode formed there within;
first p-doped layers between a first one of the two active trenches and a first one of the two insulated trenches, and between a second one of the two active trenches and a second one of the two insulated trenches; and
second p-doped layers between a first one of the two insulated trenches and a second one of the two insulated trenches with the junction arranged therebetween, wherein
the second p-doped layers are provided on an external surface of the respective first one and second one of the two insulated trenches at a depth and a thickness set to form a current path when the power semiconductor device is in an OFF state; and
a p-type concentration of the first p-doped layer defined by Cb, and a p-type concentration of the second p-doped layer defined by Ca is set such that $Cb/Ca > 10$.

2. The semiconductor device according to claim 1, wherein a length of the second p-doped layers is approximately equal to a depth of the electrode of the insulated trenches.

3. The semiconductor device according to claim 1, wherein a cross-sectional shape of the insulated trenches comprises a tapered shape that narrows with increasing depth of the insulated trenches.

4. The semiconductor device according to claim 3, wherein each of the second p-doped layers are tapered on a first side that contacts with external surfaces of respective ones of the insulated trenches and are not tapered on a second side that faces the junction.

5. The semiconductor device according to claim 1, wherein the electrode of the insulated trenches comprises one of: polysilicon; and metal.

6. An array of power semiconductor devices according to claim 1, comprising a series of the power semiconductor devices along a length direction of a substrate.

7. The array of power semiconductor devices according to claim 6, wherein from a top view perspective of the array of power semiconductor devices, the series of power semiconductor devices is continuously arranged in a length direction of the array.

8. The array of power semiconductor devices according to claim 6, wherein from a top view perspective of the array of power semiconductor devices, the series of power semiconductor devices is arranged such that the second p-doped layers are alternately arranged with areas where the second p-doped layers are not provided along the length direction of the array at regular intervals on both sides of the junction.

9. The array of power semiconductor devices according to claim 6, wherein from a top view perspective of the array of power semiconductor devices, the series of power semiconductor devices is arranged such that the second p-doped layers are alternately arranged with areas where the second p-doped layers are not provided along the length direction of the array at staggered intervals on both sides of the junction.

10. The array of power semiconductor devices according to claim 6, wherein from a top view perspective of the array of power semiconductor devices, the series of power semiconductor devices is arranged such that the second p-doped layers are arranged along the length direction of the array to extend between the insulated trenches at regular intervals.

* * * * *